United States Patent
Wang et al.

(10) Patent No.: US 8,837,220 B2
(45) Date of Patent: Sep. 16, 2014

(54) NONVOLATILE MEMORY AND MANIPULATING METHOD THEREOF

(71) Applicant: United Microelectronics Corp., Hsinchu (TW)

(72) Inventors: Shen-De Wang, Hsinchu County (TW); Wen-Chung Chang, Hsinchu (TW); Ya-Huei Huang, Tainan (TW); Feng-Ji Tsai, Hsinchu (TW); Chien-Hung Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 10 days.

(21) Appl. No.: 13/741,442

(22) Filed: Jan. 15, 2013

(65) Prior Publication Data

US 2014/0198574 A1 Jul. 17, 2014

(51) Int. Cl.
 *G11C 11/34* (2006.01)
 *G11C 16/14* (2006.01)
 *H01L 27/088* (2006.01)
 *G11C 16/10* (2006.01)

(52) U.S. Cl.
 CPC .............. *G11C 16/14* (2013.01); *H01L 27/088* (2013.01); *G11C 16/10* (2013.01)
 USPC .................. 365/185.15; 365/185.24

(58) Field of Classification Search
 CPC ............................ G11C 16/10; G11C 11/4091
 USPC ....................... 365/185.15, 185.24
 See application file for complete search history.

(56) References Cited

U.S. PATENT DOCUMENTS

| | | | | |
|---|---|---|---|---|
| 5,892,826 | A * | 4/1999 | Brown et al. | 713/190 |
| 6,011,725 | A | 1/2000 | Eitan | |
| 6,076,177 | A * | 6/2000 | Fontenot et al. | 714/724 |
| 6,094,394 | A | 7/2000 | La Rosa | |
| 6,128,225 | A | 10/2000 | Campardo et al. | |
| 7,049,189 | B2 | 5/2006 | Chang et al. | |
| 7,119,394 | B2 * | 10/2006 | Hsieh et al. | 257/316 |
| 8,546,214 | B2 * | 10/2013 | Orimoto et al. | 438/239 |
| 2007/0108508 | A1 * | 5/2007 | Lin et al. | 257/324 |
| 2010/0106953 | A1 * | 4/2010 | Morad et al. | 713/2 |
| 2010/0146159 | A1 * | 6/2010 | Lerman | 710/23 |
| 2012/0003364 | A1 * | 1/2012 | Lai et al. | 365/103 |
| 2012/0018795 | A1 | 1/2012 | Chen et al. | |

OTHER PUBLICATIONS

U.S. Appl. No. 12/843,093, filed Jul. 26, 2010.

* cited by examiner

*Primary Examiner* — Michael Tran
(74) *Attorney, Agent, or Firm* — WPAT, PC; Justin King

(57) ABSTRACT

A manipulating method of a nonvolatile memory is provided and comprises following steps. The nonvolatile memory having a plurality of memory cell is provided. Two adjacent memory cells correspond to one bit and comprise a substrate, a first and another first doping regions, a second doping region, a charge trapping layer, a control gate, a first bit line, a source line and a second bit line different from the first bit line. A first and a second channel are formed. The charge trapping layer is disposed on the first and the second channels. The two adjacent memory cells are programmed by following steps. A first positive and negative voltages are applied to the control gate between the first and the second doping regions and the control gate between the second and the another first doping regions, respectively. A first voltage is applied to the source line.

20 Claims, 4 Drawing Sheets

NONVOLATILE MEMORY AND MANIPULATING METHOD THEREOF

BACKGROUND OF THE INVENTION

1. Field of the Invention

The invention relates in general to a nonvolatile memory and a manipulating method thereof, and more particularly to a nonvolatile memory with two adjacent memory cells in one bit and the manipulating method thereof.

2. Description of the Related Art

Memories are widely used in daily life, such as in computers, household appliance, portable communication products and mobile vehicles. According to different storage capacity with power supply, memories can be roughly divided into volatile memory and non volatile memory (NVM). Volatile memory requires power to maintain the stored information. In contrast, NVM can retain the stored information even when not powered.

No matter volatile memory or non volatile memory (NVM), memories with high endurance and long data retention can consist with market requirement and strict standard (such as vehicle specification).

SUMMARY OF THE INVENTION

The invention is directed to a nonvolatile memory and a manipulating method thereof. When manipulating the nonvolatile memory having a structure of two adjacent memory cells in one bit, voltages with different polarities can be applied to the two adjacent memory cells so that the sensing margin of the nonvolatile memory can be increased.

According to a first aspect of the present invention, a manipulating method of a nonvolatile memory is provided. The manipulating method comprises following steps. The nonvolatile memory having a plurality of memory cell is provided. Two adjacent memory cells of the memory cells correspond to one bit and comprise a substrate, a first doping region and another first doping region, a second doping region disposed between the first doping region and the another first doping region, a charge trapping layer, a control gate disposed on the charge trapping layer, a first bit line coupling to the first doping region, a source line coupling to the second doping region and a second bit line coupling to the another first doping region. The first bit line and the second bit line are different. A first channel is formed between the first doping region and the second doping region, and a second channel is formed between the second doping region and the another first doping region. The charge trapping layer is disposed on the first channel and the second channel. The two adjacent memory cells are programmed by following steps. A first positive voltage is applied to the control gate between the first doping region and the second doping region. A first negative voltage is applied to the control gate between the second doping region and the another first doping region. A first voltage is applied to the source line, so that a voltage level of the source line is larger than a voltage level of the first bit line and a voltage level of the second bit line.

According to a second aspect of the present invention, a nonvolatile memory comprising a plurality of memory cells is disclosed. Two adjacent memory cells of the memory cells correspond to one bit and comprise a substrate, a first doping region and another first doping region disposed in a surface area of the substrate, a second doping region disposed between the first and the another first doping region, a charge trapping layer, a control gate, a first bit line, a source line and a second bit line. A first and a second channels are respectively formed between the first and the second doping region, and the second and the another first doping region. The charge trapping layer is disposed on the first and the second channels. The first bit line couples to the first doping region, the source line couples to the second doping region, and the second bit line couples to the another first doping region. The first and the second bit lines are different.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
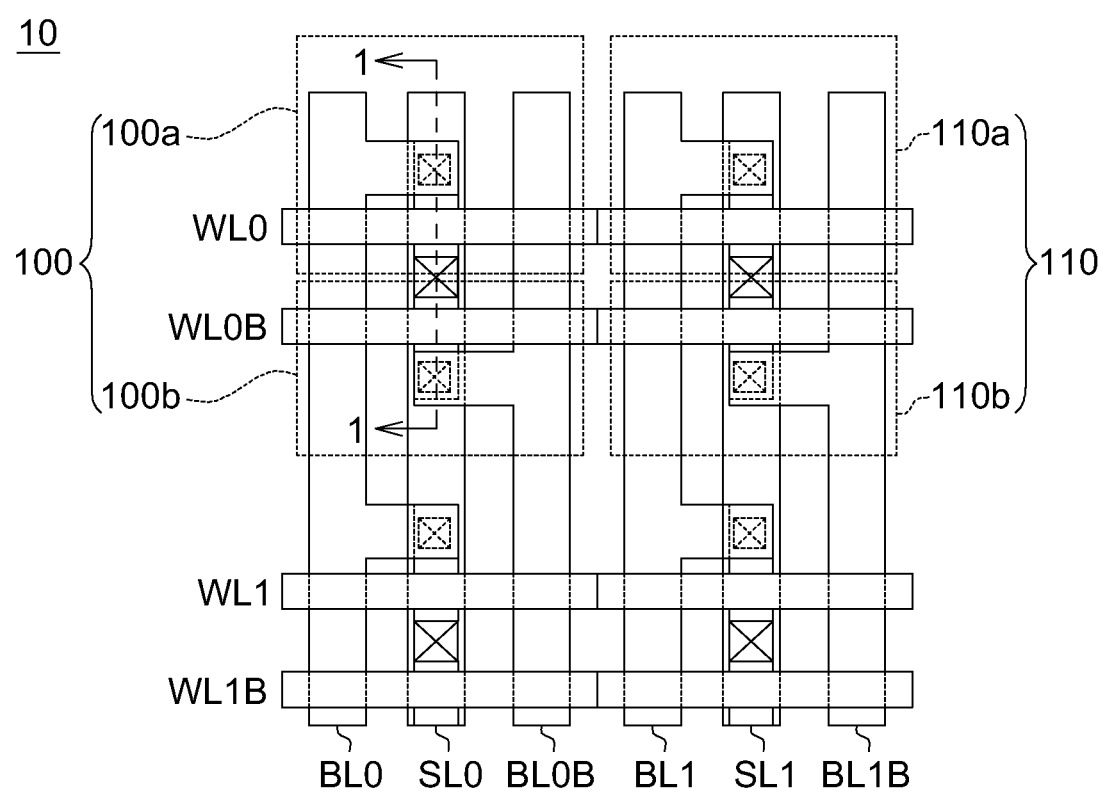
FIG. 1A illustrates a part of a layout of a nonvolatile memory according to an embodiment of the invention.

Please refers to FIG. 1A. FIG. 1A illustrates a part of a layout of nonvolatile memory 10. The nonvolatile memory 10 has a plurality of memory cell, such as memory cell 100a and memory cell 100b. The two adjacent memory cell 100a and memory cell 100b correspond to one bit 100.

Figure 1B:
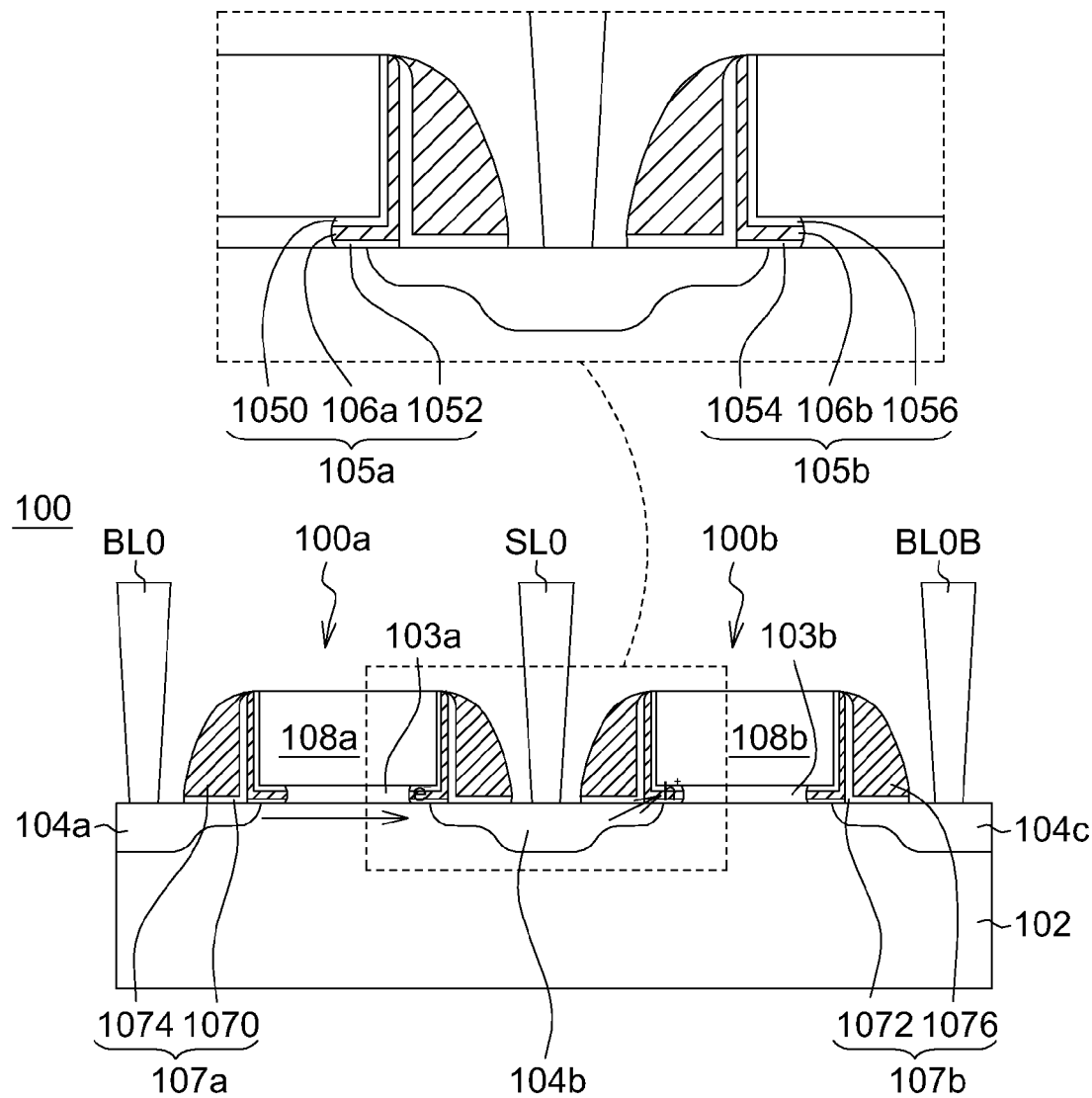
FIG. 1B illustrates a cross section view of one bit of the nonvolatile memory in FIG. 1A along a cross section line 1-1.

FIG. 1B illustrates a cross section view of the bit 100 in FIG. 1A along a cross section line 1-1. Please refers to FIG. 1A~1B, in bit 100, two adjacent memory cell 100a and memory cell 100b of the nonvolatile memory 10 can comprise a substrate 102, a dielectric layer 103a, a dielectric layer 103b, a first doping region 104a, a second doping region 104b and another first doping region 104c, an oxide layer 1050, an oxide layer 1052, an oxide layer 1054, an oxide layer 1056, a charge trapping layer 106a, a charge trapping layer 106b, a spacer 107a, a spacer 107b, a control gate 108a and a control gate 108b.

The dielectric layer 103a and the dielectric layer 103b for example are gate dielectric layer. The first doping region 104a and the another first doping region 104c are disposed in a surface area of the substrate 102. The second doping region 104b is disposed between the first doping region 104a and the another first doping region 104c. A first channel is formed between the first doping region and the second doping region, and a second channel is formed between the second doping region 104b and the another first doping region 104a. Charges can pass through the first channel and the second channel.

The charge trapping layer 106a and the charge trapping layer 106b are respectively disposed on first channel and second channel. The control gate 108a and the control gate 108b are respectively disposed on the charge trapping layer 106a and the charge trapping layer 106b. In other words, control gate 108a is disposed on the first channel, and the control gate 108b is disposed on the second channel. The spacer 107a can comprise an oxide layer 1070 and a nitride layer 1074, and the spacer 107b can comprise an oxide layer 1072 and a nitride layer 1076. The nitride layer 1074 and the nitride layer 1076 for example can comprise silicon nitride.

As shown in FIG. 1A, in one embodiment, the first word line WL0, the second word line WL0B, third word line WL1 and fourth word line WL1B are sequentially arranged, and the control gate 108a couples to first word line WL0, the control gate 108b couples to the second word line WL0B. The first word line WL0 and the second word line WL0B are arranged adjacently.

The first bit line BL0, the second bit line BL0B, the third bit line BL1 and the fourth bit line BL1B are sequentially arranged, and the first word line WL0, the second word line WL0B, the third word line WL1 and the fourth word line WL1B are substantially vertical to the first bit line BL0, the second bit line BL0B, the third bit line BL1 and the fourth bit line BL1B. The first bit line BL0 couples to the first doping region 104a, the source line SL0 couples to second doping region 104b, the second bit line BL0B couples to another first doping region 104a, the source line SL0 is disposed between the first bit line BL0 and the second bit line BL0B. The first bit line BL0 and the second bit line BL0B are different.

In one embodiment, the first doping region 104a and the another first doping region 104c are for example a drain region, the second doping region is for example a source region 104b. In this case, two adjacent memory cell 100a and memory cell 100b share the same source region 104b.

As shown in FIG. 1A, the another two adjacent memory cell 110a and memory cell 110b correspond to another one bit 110, the two adjacent memory cell 110a and memory cell 110b comprise a third bit line BL1, a fourth bit line BL1B and another source line SL1. The source line SL1 is disposed between the third bit line BL1 and the fourth bit line BL1B. The third bit line BL1 and the second bit line BL0B are arranged adjacently.

FIG. 1B shows local trap Oxide-Nitride-Oxide (local trap ONO) memory cell 100a and memory cell 100b as an example embodiment to be illustrated, and the invention is not limited thereto. The charge trapping layer 106a and charge trapping layer 106b can be nitride (such as silicon nitride). As shown in the local enlarged view of FIG. 1B, the oxide layer 1050, the charge trapping layer 106a and the oxide layer 1052 can form a oxide-nitride-oxide (ONO) structure 105a. The oxide layer 1054, the charge trapping layer 106b and the oxide layer 1056 can form a oxide-nitride-oxide (ONO) structure 105b.

The type of the memory cell 100a and the type of the memory cell 100b in this invention are not limited thereto. In other embodiment, the memory cell 100a and the memory cell 100b can be Silicon-Oxide-Nitride-Oxide-Silicon (SONOS) memory cells or floating gate memory cells. When memory cell 100a and memory cell 100b are local trap ONO memory cells or SONOS, the charge trapping layer 106a and the charge trapping layer 106b can comprise nitride. When memory cell 100a and memory cell 100b are floating gate memory cells, the charge trapping layer 106a and the charge trapping layer 106b can comprise polysilicon.

The structure of the charge trapping layer 106a and the charge trapping layer 106b are not limited, for example, the charge trapping layer 106a can be two local L-shaped layer, respectively disposed adjacent to the first doping region 104a and the second doping region 104b. The charge trapping layer 106a can also be a single planar layer disposed between the first doping region 104a and the second doping region 104b, or a plurality of particles or structures arranged between the first doping region 104a and the second doping region 104b, and the invention is not limited thereto.

The manipulating method of nonvolatile memory 10 are described below according to the embodiments of the invention. During programming, erasing and reading processes, the range of voltages to be applied to the bit line, the word line and the source line are shown in table 1. The carrier type such as electrons or the holes to be trapped in the trapping layer 106a and the charge trapping layer 106b, and the direction of the electron current passing through the channels during programming and erasing process, are shown in table 2.

In table 1, the voltage level of bulk is for example 0V. Merely the voltage conditions to be applied to the selected bit 100 during programming, erasing and reading processes are shown. If more than one bit, such as 8 bits (one byte) or 1024 bits, should be programmed, erased and read, other bit lines, word lines and source lines can be applied to voltages according to the rule of WL0, WL0B, BL0, BL0B and SL0 in table 1.

FIG. 1B illustrates the manipulating method of memory cell 100a and memory cell 100b in bit 100 during the programming process. Please refers to both FIG. 1B and table 1~table 2, during programming process of two adjacent memory cell 100a and memory cell 100b in bit 100, a first positive voltage (5~10V) can be applied to the control gate 108a between the first doping region 104a and the second doping region 104b. Besides, a first negative voltage (−4~−10V) can be applied to the control gate 108b between the second doping region 104b and another first doping region 104c. The first positive voltage and the first negative voltage can be applied simultaneously.

A 0V can be applied to the first bit line BL0, and a floating voltage or 0V can be applied to the second bit line BL0B. A first voltage (4~8V) can be applied to the source line, so that the voltage level of the source line SL0 is larger than the voltage level of the first bit line BL0 and the voltage level of the second bit line BL0B. In this case, when programming two adjacent memory cell 100a and memory cell 100b, channel hot electron process occurs in the charge trapping layer 106a on the first channel, and band to band induced hot hole process occurs in the charge trapping layer 106b on the second channel.

TABLE 1

| | Program | Erase condition 1 | Erase Condition 2 | Erase Condition 3 | Read |
|---|---|---|---|---|---|
| WL0 | Positive voltage (5~10 V) | negative voltage (−4~−10 V) | | | Lower voltage (1.8~3.3 V) |
| WL0B | negative voltage (−4~−10 V) | Positive voltage (5~10 V) | Negative voltage (−4~−10 V) | 0 V | Lower voltage (1.8~3.3 V) |
| BL0 | 0 V | 0 V or floating | | | Low voltage (0.3~1.2 V) |
| BL0B | 0 V or floating | 0 V | 0 V or floating | 0 V or floating | Low voltage (0.3~1.2 V) |
| SL0 | Positive voltage (4~8 V) | | | | 0 V |
| Other bit line/word line/source line | 0 V | 0 V | 0 V | 0 V | 0 V |

TABLE 2

| | Program (charge trapping layer) | Erase (charge trapping layer) | | | Read (channel electron current) |
|---|---|---|---|---|---|
| | | condition 1 | condition 2 | condition 3 | |
| Memory cell 100a | electrons | | holes | | From second doping region 104b to first doping region 104a |

TABLE 2-continued

| | Program (charge trapping layer) | Erase (charge trapping layer) | | | Read (channel electron current) |
|---|---|---|---|---|---|
| | | condition 1 | condition 2 | condition 3 | |
| Memory cell 100b | holes | electrons | | holes | From second doping region 104b to another first doping region 104c |

Please refers to table 1~table 2 and FIG. 1B, during erasing process, the electrons trapped by the memory cell 100a in FIG. 1B should be compensated. Therefore, a second negative voltage (such as −4~−10V) should be applied to the control gate 108a. The second voltage ranges from 4V~8V can be applied to the source line SL0, and a floating voltage or 0V can be applied to the first bit line BL0 and the second bit line, so that the voltage level of the source line SL0 is larger than the voltage levels of the first bit line BL0 and second the bit line BL0B. In this case, when erasing two adjacent memory cell 100a and memory cell 100b, band to band induced hot hole process occurs in the charge trapping layer 106a on the first channel, to compensate the electrons trapped by the charge trapping layer 106a during the programming process in FIG. 1B.

Since memory cells are less sensitive to the holes, whether to inject electrons for compensating the holes trapped by the charge trapping layer 106b during the erasing process or not would not affect the result of erasing. Therefore, three voltage conditions can be selected for applying to the control gate 108b during the erasing process. For example, any one of a second positive voltage ranges between 5V~10V (condition 1), a third negative voltage ranges between −4~−10V (condition 2) or voltage level of 0V (condition 3) can be selected and be applied to the control gate 108b. In other words, when performing erase process, channel hot electron (condition 1) occurs in the charge trapping layer 106b on the second channel to compensate the holes trapped by the charge trapping layer 106b during the programming process. Otherwise, holes can be induced in the charge trapping layer 106b (condition 2) on the second channel or nothing happened in the charge trapping layer 106b (condition 3).

Please refers to tables 1~2 and FIG. 1B, when performing reading process to read the two adjacent memory cell 100a and memory cell 100b, a third voltage with a lower voltage level (such as 1.8~3.3V) can be applied to control gate 108a. Besides, a fourth voltage with a lower voltage level (such as 1.8~3.3V) can be applied to the control gate 108b between the second doping region 104b and another first doping region 104c. A fifth voltage with low voltage level (such as 0.3~1.2V) can be applied to the first bit line BL0, and a sixth voltage (such as 0V) can be applied to the second bit line BL0B, so that the voltage levels of the first bit line BL0 and second bit line BL0B are larger than the voltage level of the source line SL0.

Both of the third voltage and the fourth voltage range from 1.8V to 3.3V. The voltage levels of the third voltage and the fourth voltage can be the same or different. The fifth voltage and the sixth voltage range from 0.3V to 1.2V. The voltage levels of the fifth voltage and the sixth voltage can be the same or different. In one embodiment, an electron flow can be generated and flowing from the second doping region 104b to the first doping region 104a through the first channel, and another electron flow can be generated and flowing from the second doping region 104b to another first doping region 104c through the second channel in the two adjacent memory cell 100a and memory cell 100b of the programmed bit 100 during a reading process. The electron flow on the first channel is smaller than the another electron flow on the second channel.

Figure 2:
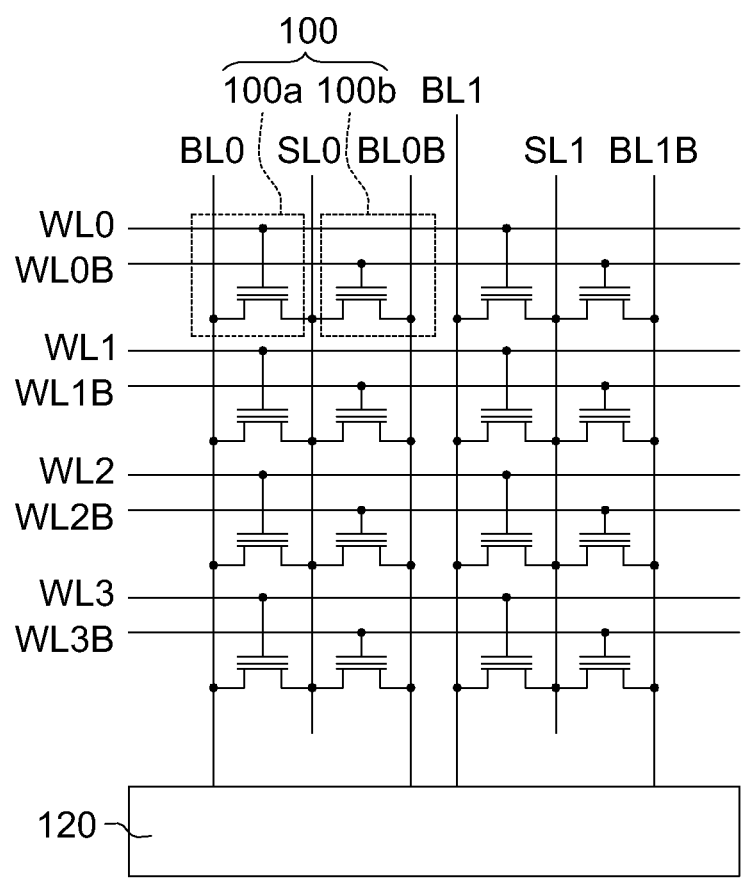
FIG. 2 illustrates an electrical circuit of a nonvolatile memory according to one embodiment of the invention.
Figure 3:
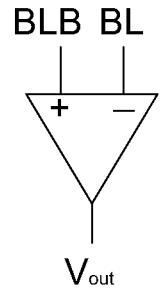
FIG. 3 illustrates and electrical circuit of a sensing amplifier in FIG. 2.

FIG. 2 illustrates an electrical circuit of the nonvolatile memory 10 according to one embodiment of the invention. Same elements are represented by same labels in FIGS. 1A~1B and 2, these elements are not described in detail. FIG. 3 illustrates an electrical circuit of the sensing amplifier 120 in FIG. 2.

Please refers to both FIGS. 2~3, the bit line BL0, the bit line BL0B, the bit line BL1 and the bit line BL1B of the nonvolatile memory 10 couple to a sensing amplifier 120. The sensing amplifier 120, such as a comparator, can compare the output current of the bit line BL1 and the output current of the bit line BL1B and obtains a voltage Vout corresponding to a comparison result with a high voltage level or a low voltage level, so that the sensing amplifier 120 can convert the current signal into a digital signal with 0 or 1.

Figure 4:
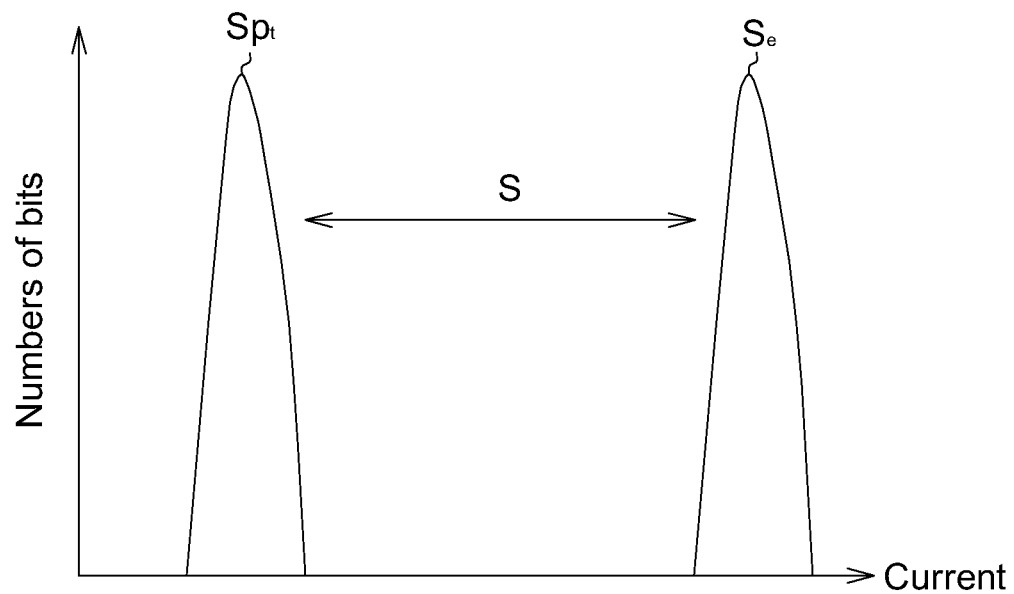
FIG. 4 illustrates a sensing margin of a nonvolatile memory according to one embodiment of the invention.

FIG. 4 illustrates a sensing margin of the nonvolatile memory 10 according to one embodiment of the invention. Please refers to FIGS. 2 and 4, curve $Sp_t$ represents the output current of the bit line BL during programming state, and curve $S_e$ represents the output current of the bit line BLB during programming state. The current value are shown on horizontal axis and the number of bits to be sensed are shown on vertical axis. The electrons or holes are trapped by memory cell 100a and memory cell 100b during programming and erasing processes, respectively. That is to say, the polarities of the carriers trapped by the memory cell 100a and memory cell 100b are opposite to each other; therefore, the difference between the output currents of the bit line BL1 and the output currents of the bit line BL1B is large. Therefore, the sensing margin between the bit line BL1 and the bit line BL1B is also large.

For example, if the output current of the bit line BL1 is 5 μampere (μA) and the output current of the bit line BL1B is 50 μA, the sensing margin can be 45 μA. Therefore, the reading speed can be improved in this case. Besides, every time the programming, the erasing and the reading processes are performed, the memories degrade because the distance of the sensing margin S may decrease after several programming, erasing and reading processes. The nonvolatile memory 10 can provide a larger sensing margin S for degradation during the processes, so that the numbers of programming time, the erasing time and the reading time, as well as the lifetime of the nonvolatile memory 10 can be increased. The nonvolatile memory 10 can achieve substantially 2 times the reliability more than that of a conventional nonvolatile memory.

Based on the above, each bit of the nonvolatile memory 10 according to the embodiments of the invention comprises two adjacent memory cells. In one embodiment, the carriers (such as electrons or holes) with opposite polarities are trapped by the two adjacent memory cells during the program and erase processes, so that the reading speed of the memory cells can be improved. Besides, the opposite polarities of the carriers trapped by the two adjacent memory cells lead to a larger sensing margin, so that the lifetime of the memory can be increased. Besides, data retention and endurance of the memory are also improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manipulating method of a nonvolatile memory, comprising:
providing the nonvolatile memory having a plurality of memory cell, two adjacent memory cells of the memory cells correspond to one bit, the two adjacent memory cells comprising a substrate, a first doping region and another first doping region, a second doping region disposed between the first doping region and the another first doping region, a charge trapping layer, a control gate disposed on the charge trapping layer, a first bit line coupling to the first doping region, a source line coupling to the second doping region and a second bit line coupling to the another first doping region, wherein the first bit line and the second bit line are different, a first channel formed between the first doping region and the second doping region, and a second channel formed between the second doping region and the another first doping region, the charge trapping layer disposed on the first channel and the second channel; and
programming the two adjacent memory cells, comprising:
applying a first positive voltage to the control gate between the first doping region and the second doping region;
applying a first negative voltage to the control gate between the second doping region and the another first doping region; and
applying a first voltage to the source line, so that a voltage level of the source line is larger than a voltage level of the first bit line and a voltage level of the second bit line.

2. The manipulating method according to claim 1, wherein the first positive voltage and the first negative voltage are applied simultaneously.

3. The manipulating method according to claim 1, wherein channel hot electron occurs in the charge trapping layer on the first channel and band to band induced hot hole occurs in the charge trapping layer on the second channel when programming the two adjacent memory cells.

4. The manipulating method according to claim 1, further comprising:
erasing the two adjacent memory cell, the erasing process comprising:
applying a second negative voltage to the control gate between the first doping region and the second doping region; and
applying a second positive voltage, a third negative voltage or 0V voltage to the control gate between the first doping region and the second doping region; and
applying a second voltage to the source line, so that a voltage level of the source line is larger than a voltage level of the first bit line and a voltage level of the second bit line.

5. The manipulating method according to claim 4, wherein the first positive voltage and the second positive voltage range between 5V to 10V, the first negative voltage, second negative voltage and the third negative voltage range between −4V to −10V, and the first voltage and the second voltage range between 4V to 8V.

6. The manipulating method according to claim 4, wherein band to band induced hot hole occurs in the charge trapping layer on the first channel of the two adjacent memory cells during the erasing process.

7. The manipulating method according to claim 1, further comprising reading the two adjacent memory cell, the reading process comprising:
applying a third voltage to the control gate between the first doping region and the second doping region;
applying a fourth voltage to the control gate between the second doping region and the another first doping region; and
applying a fifth voltage to the first bit line, and applying a sixth voltage to the second bit line, so that a voltage level of the first bit line and a voltage level of the second bit line are larger than a voltage level of the source line.

8. The manipulating method according to claim 7, wherein the third voltage and the fourth voltage range from 1.8V to 3.3V, the fifth voltage and the sixth voltage range from 0.3V to 1.2V.

9. The manipulating method according to claim 7, wherein a electron current flow is generated and flows from the second doping region to the first doping region through the first channel, and another electron current flow is generated and flows from the second doping region to the another first doping region through the second channel during the reading process.

10. The manipulating method according to claim 1, further comprising:
providing a sensing amplifier coupling to the first bit line and the second bit line; and
the sensing amplifier outputting a comparison result according to an output current of the first bit line and an output current of the second bit line, wherein the comparison result is related to a high voltage level a low voltage level.

11. The manipulating method according to claim 1, wherein in the process of providing a nonvolatile memory, the memory cells are local trap ONO memory cells, SONOS memory cells or floating gate memory cells.

12. A nonvolatile memory having a plurality of memory cell, two adjacent memory cells of the memory cells corresponding to a bit, the two adjacent memory cell comprising:
a substrate;
a first doping region and a another first doping region, disposed in a surface area of the substrate;
a second doping region disposed between the first doping region and the another first doping region, a first channel formed between the first doping region and the second doping region, and a second channel formed between the second doping region and the another first doping region;
a charge trapping layer disposed on the first channel and the second channel;
a control gate disposed on the charge trapping layer;
a first bit line coupling to the first doping region;
a source line coupling to the second doping region; and
a second bit line coupling to the another first doping region, the first bit line and the second bit line are different.

13. The nonvolatile memory according to claim 12, wherein the charge trapping layer comprises nitride or polysilicon.

14. The nonvolatile memory according to claim 12, wherein the memory cells are local trap ONO memory cells, SONOS memory cells or floating gate memory cells.

15. The nonvolatile memory according to claim 12, wherein the first doping region and the another first doping region are drain regions, and the second doping region is a source region.

16. The nonvolatile memory according to claim 12, wherein the source line is disposed between the first bit line and the second bit line.

17. The nonvolatile memory according to claim 12, wherein the two adjacent memory cells share a same source region.

18. The nonvolatile memory according to claim 12, further comprising:
- a sensing amplifier coupling to the first bit line and the second bit line, for outputting a comparison result according to an output current of the first bit line and an output current of the second bit line, wherein the comparison result is related to a high voltage level or a low voltage level.

19. The nonvolatile memory according to claim 12, wherein another two adjacent memory cells of the memory cells corresponds to another bit, the another two adjacent memory cell comprising:
- a third bit line and a fourth bit line; and
- an another source line disposed between the third bit line and the fourth bit line, wherein the third bit line and the second bit line are arranged adjacently.

20. The nonvolatile memory according to claim 12, wherein the control gate comprises control gate disposed on the first channel and control gate disposed on the second channel, the control gate disposed on the first channel couples to a first word line, the control gate disposed on the second channel couples to a second word line, the first word line and the second word line arranged adjacently.

* * * * *